United States Patent
Sun et al.

(10) Patent No.: US 8,129,029 B2
(45) Date of Patent: Mar. 6, 2012

(54) EROSION-RESISTANT PLASMA CHAMBER COMPONENTS COMPRISING A METAL BASE STRUCTURE WITH AN OVERLYING THERMAL OXIDATION COATING

(75) Inventors: Jennifer Y. Sun, Sunnyvale, CA (US); Li Xu, San Jose, CA (US); Kenneth S. Collins, San Jose, CA (US); Thomas Graves, Los Altos, CA (US); Ren-Guan Duan, Fremont, CA (US); Senh Thach, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1055 days.

(21) Appl. No.: 12/004,907

(22) Filed: Dec. 21, 2007

(65) Prior Publication Data

US 2009/0162647 A1 Jun. 25, 2009

(51) Int. Cl.
*B32B 9/00* (2006.01)
(52) U.S. Cl. ......... 428/469; 428/472; 428/701; 428/702
(58) Field of Classification Search ............... 427/255.4, 427/374.1, 399, 376.4, 380, 453, 596, 597; 428/336, 632, 469, 472; 416/241
See application file for complete search history.

(56) References Cited

U.S. PATENT DOCUMENTS

| 5,366,585 A | 11/1994 | Robertson et al. ............ 156/643 |
| 6,565,984 B1 | 5/2003 | Wu et al. ..................... 428/472.2 |
| 6,942,929 B2 | 9/2005 | Han et al. ...................... 428/650 |
| 2002/0110698 A1* | 8/2002 | Singh ............................. 428/472 |
| 2004/0191545 A1 | 9/2004 | Han et al. ...................... 428/472 |
| 2005/0037193 A1 | 2/2005 | Sun et al. ...................... 428/332 |
| 2005/0100757 A1* | 5/2005 | Stowell et al. ................ 428/621 |

FOREIGN PATENT DOCUMENTS

JP 03287797 12/1991

OTHER PUBLICATIONS thefreedictionary.com.*

* cited by examiner

*Primary Examiner* — Timothy Speer
(74) *Attorney, Agent, or Firm* — Shirley L. Church Esq (57) ABSTRACT

An article which is resistant to corrosion or erosion by chemically active plasmas and a method of making the article are described. The article is comprised of a metal or metal alloy substrate having on its surface a coating which is an oxide of the metal or metal alloy. The structure of the oxide coating is columnar in nature. The grain size of the crystals which make up the oxide is larger at the surface of the oxide coating than at the interface between the oxide coating and the metal or metal alloy substrate, and wherein the oxide coating is in compression at the interface between the oxide coating and the metal or metal alloy substrate. Typically the metal is selected from the group consisting of yttrium, neodymium, samarium, terbium, dysprosium, erbium, ytterbium, scandium, hafnium, niobium or combinations thereof.

10 Claims, 6 Drawing Sheets

EROSION-RESISTANT PLASMA CHAMBER COMPONENTS COMPRISING A METAL BASE STRUCTURE WITH AN OVERLYING THERMAL OXIDATION COATING

RELATED APPLICATIONS

The present application is related to the following applications: application Ser. No. 11/796,210, of Sun et al., filed Apr. 27, 2007, titled: "Method of Reducing The Erosion Rate Of Semiconductor Processing Apparatus Exposed To Halogen-Containing Plasmas", which is currently pending; U.S. application Ser. No. 11/796,211, of Sun et al., filed Apr. 27, 2007, titled: "Method And Apparatus Which Reduce The Erosion Rate Of Surfaces Exposed To Halogen-Containing Plasmas", which is currently pending; and, U.S. application Ser. No. 11/890,156 of Sun et al., filed Aug. 2, 2007, titled: "Plasma-resistant Ceramics With Controlled Electrical Resistivity", which is currently pending. The subject matter of all of these patents and applications is hereby incorporated by reference into the present description.

BACKGROUND

1. Field

Embodiments of the present invention relate to an erosion-resistant semiconductor processing component which includes an yttrium metal substrate. A method of fabricating such a component is also described.

2. Background

This section describes background subject matter related to the disclosed embodiments of the present invention. There is no intention, either express or implied, that the background art discussed in this section legally constitutes prior art.

Corrosion (including erosion) resistance is a critical property for apparatus components and liners used in semiconductor processing chambers, where corrosive environments are present. Although corrosive plasmas are present in the majority of semiconductor processing environments, including plasma enhanced chemical vapor deposition (PECVD) and physical vapor deposition (PVD), the most corrosive plasma environments are those used for cleaning of processing apparatus and those used to etch semiconductor substrates. This is especially true where high-energy plasma is present and combined with chemical reactivity to act upon the surface of components present in the environment.

Process chamber liners and component apparatus present within the processing chambers used to fabricate electronic devices and micro-electro-mechanical systems (MEMS) are frequently constructed from aluminum and aluminum alloys. Surfaces of the process chamber and component apparatus (present within the chamber) are frequently anodized to provide a degree of protection from the corrosive environment. However, the integrity of the anodization layer may be deteriorated by impurities in the aluminum or aluminum alloy, so that corrosion begins to occur early, shortening the life span of the protective coating. The plasma resistance properties of aluminum oxide are not positive in comparison with some other ceramic materials. As a result, ceramic coatings of various compositions have been used in place of the aluminum oxide layer mentioned above; and, in some instances, have been used over the surface of the anodized layer to improve the protection of the underlying aluminum-based materials.

Yttrium oxide is a ceramic material which has shown considerable promise in the protection of aluminum and aluminum alloy surfaces which are exposed to halogen-containing plasmas of the kind used in the fabrication of semiconductor devices. An yttrium oxide coating has been used and applied over an anodized surface of a high purity aluminum alloy process chamber surface, or a process component surface, to produce excellent corrosion protection (e.g. U.S. Pat. No. 6,777,873 to Sun et al., mentioned above). The protective coating may be applied using a method such as spray coating, physical vapor deposition (PVD) or chemical vapor deposition (CVD) by way of example.

The substrate base material of the chamber wall or liner, of an apparatus component may be a ceramic material ($Al_2O_3$, $SiO_2$, AlN, etc.), may be aluminum, or stainless steel, or may be another metal or metal alloy. Any of these may have a sprayed film over the base material. The film may be made of a compound of a III-B element of the periodic table, such as $Y_2O_3$ The film may substantially comprise $Al_2O_3$ and $Y_2O_3$. A sprayed film of yttrium-aluminum-garnet (YAG) has also been mentioned. Examples of a sprayed film thickness range from 50 μm to 300 μm.

There have been problems with aluminum and aluminum alloys which have been spray coated with an yttrium oxide-comprising film to provide corrosion and erosion resistance. While the yttrium oxide-comprising film surface is more corrosion and erosion resistant than the surface of aluminum, or aluminum alloys, or anodized aluminum, the resistance is significantly less than that of a solid yttrium oxide sintered component. However, the electrical conductivity of a solid, sintered yttrium oxide chamber liner or component may be a disadvantage in instances where a conductivity in the range of aluminum is desired. The mechanical properties of the solid, sintered yttrium oxide are a disadvantage compared with aluminum, which is not so brittle; for example, aluminum offers a better tensile strength, yield strength, and flexural strength.

There is a need in the semiconductor industry for improved materials which provide both a highly corrosion and erosion resistant surface, while providing electrical and mechanical properties which are competitive with aluminum.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand the invention and that certain well known processes and apparatus are not illustrated herein in order not to obscure the inventive nature of the subject matter of the disclosure.

FIGS. 4A through 4E show various aspects of the growth of a protective yttrium oxide coating over the surface of a metal yttrium substrate, in areas which have been machined to form openings through the metal yttrium substrate.

DESCRIPTION

Embodiments of the present invention pertain to specialty yttrium metal and yttrium metal alloy substrates having an yttrium oxide-comprising coating formed on the metal surface by a thermal oxidation process. Such materials can be used in processing environments of the kind encountered in the production of semiconductor and MEMS devices. In one aspect, the metal yttrium and the yttrium oxide produced by thermal oxidation possess similar thermal expansion coefficients, compared with the base substrate metal, and this provides an improved interface between the coating and the underlying substrate. As a result, less stress is created between the metal yttrium and the yttrium oxide coating, and the performance lifetime of the component is increased. In one aspect, the metal yttrium and the yttrium oxide produced by thermal oxidation also exhibit similar thermal conductivity, and that improves the temperature uniformity of the entire component during semiconductor and MEMS processing operations.

It has been determined by experimentation that the yttrium oxide coating produced by the thermal oxidation process in accordance with the present invention, is placed in compression by the underlying metal substrate, when the substrate is cooled after the thermal oxidation process. Due to this compression, the porosity of the oxide coating is reduced as the distance from the coating surface toward the underlying substrate increases. This is in combination with a strong interface which tends not to crack or create voids of the kind which occur when a yttrium oxide coating is spray coated over an aluminum substrate, for example.

A surprising advantage of the creation of a yttrium oxide coating by thermal oxidation is the ability to form a thicker coating than those which can be obtained by an anodization process, for example. A coating thickness of about 225 μm or greater, for example, can be obtained by thermal oxidation of a yttrium metal substrate at 750° C. for a time period of as little as 15 minutes, depending on the doping content of the yttrium metal. This compares with a maximum anodized yttrium oxide coating of about 8 μm-9 μm.

Embodiments of the present invention enable an ability to form a thicker coating than those known in the prior art. For example, a coating having a thickness ranging from 1 μm to about 500 μm, for example, and typically from about 10 μm to about 400 μm, depends on the temperature profile used during the thermal oxidation process. In one embodiment, an advantageous temperature profile is one where the yttrium metal (including metal alloys) is rapidly heated initially, to a desired maximum temperature, the substrate is held at the maximum temperature for a time period, and then the temperature of the substrate is gradually decreased until a point at which the formation rate of the yttrium oxide is essentially stopped.

This temperature profile is based on the discovery by the inventors that it is advantageous to have a large grain size of the yttrium oxide crystal at the top surface of the forming yttrium oxide coating, as this permits better oxygen movement into the yttrium metal substrate. Further, it is advantageous to have a small grain size of yttrium oxide crystal at the interface with the yttrium metal substrate, to provide stability at the interface. In one of the embodiments of the present invention, the temperature profile during the thermal oxidation process is set to achieve a large grain size of the yttrium oxide crystal at the top surface of the forming yttrium oxide coating. In another embodiment, the temperature profile during the thermal oxidation process is set to provide a small grain size of yttrium oxide crystal at the interface with the yttrium metal substrate.

In one embodiment, the yttrium metal substrate is rapidly heated (at a rate of about 25° C./min, for example and not by way of limitation) to a maximum temperature in the range of about 700° C. to about 1050° C. The component part being fabricated is then held at the maximum temperature for a time period during which large grain crystals are grown. This time period ranges in length from about 1% to about 5% of the time period during which the smaller grain yttrium oxide crystals are grown. The smaller crystals grow beneath the larger crystals, due to the mechanism of crystal formation, which is described subsequently herein. The smaller grain crystals of yttrium oxide which form during the temperature decrease become increasingly smaller as the process temperature drops, until the temperature reaches about 400° C. At lower temperatures, the yttrium oxide crystal growth is extremely slow.

The surprising ability to form thick yttrium oxide coatings with an average thickness in the range of up to about 225 μm or greater, for example, may be attributed to the specialized grain boundary structure of the yttrium oxide crystals which are formed, as this provides a channel for oxygen penetration as the oxidation process continues. There are two kinds of diffusion approaches of oxygen from the surface to the interface between oxide and metal. One is grain boundary diffusion and the other is grain diffusion (lattice/void). By doping trace elements into yttrium metal, or by controlling the oxygen partial pressure in the thermal oxidation process atmosphere, the priority diffusion approach can be controlled. For example, through doping of trace elements into high purity yttrium metal, the grain boundary diffusion can be adjusted to a faster oxygen diffusion path, and a given, desired yttrium oxide (yttria) layer thickness on a yttrium metal substrate can be obtained, where the thickness depends basically on thermal oxidation time. In comparison with grain boundary diffusion, the grain diffusion (lattice/void) yttrium oxide growth rate is slow. However, the grain diffusion rate (void diffusion) can be improved by optimizing the oxygen partial pressure in the thermal oxidation atmosphere, which leads to the formation of more oxygen vacancy in the yttria layer.

Typically the amount of dopant added to the yttrium metal substrate or to an alloy of yttrium metal substrate is less than about 0.1 weight percent. When dopant (trace elements) are added to the yttrium metal or yttrium metal alloy substrate, the amount of oxygen which is present in the oxidation ambient environment may range from about 5% by volume to about 25% by volume. An oxidation ambient environment which works particularly well contains about 10% by volume oxygen. When dopant is not added to the yttrium metal or yttrium metal alloy substrate, the amount of oxygen which is present in the oxidation ambient environment may range from about 5% by volume to 100% by volume. Air, which is about 21% by volume oxygen works well. This is because, when the partial pressure of oxygen in the ambient environment is lower, the oxygen tends to infuse faster into the yttrium metal or yttrium metal alloy; however, the rate of oxide formation is slow. When the partial pressure of oxygen is higher, the oxygen infuses slower, but there is more oxygen available, so the rate of oxide formation is higher. By adding dopant, and using a lower partial pressure of oxygen in the ambient environment, it is possible to obtain a desirable smaller grain size crystal at the interface of the oxide with the substrate to still have an acceptable oxide formation rate for manufacturing.

At the lower oxidation temperatures, the reaction rate of the oxygen with the metal to form an oxide is slowed. Further, once the oxidation process is completed, and the component is returned to room temperature, or while the component is under ambient semiconductor or MEMS processing conditions (at temperatures typically lower than about 400° C.) the yttrium oxide is under compression applied by the underlying yttrium metal substrate. The yttrium oxide grain size in the area of the interface with the yttrium metal can be tailored so that the amount of compression is sufficient to substantially reduce (essentially prevent) semiconductor processing reactive species from traveling down the yttria crystal to the surface of the yttrium metal substrate. At the same time, the amount of compression is not so large that it causes a fracture or separation of the yttrium oxide from the surface of the yttrium metal substrate.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

To facilitate understanding, identical reference numerals have been used, where possible, to designate identical elements that are common to the figures. It is contemplated that elements and features of one embodiment may be beneficially incorporated in other embodiments without further recitation. It is to be noted that the appended drawings illustrate only exemplary embodiments of the invention where a drawing would be particularly helpful in understanding the embodiment. Not all embodiments require a drawing for understanding, and therefore the drawings are not to be considered as limiting of the scope of the invention, for the invention may admit to other equally effective embodiments.

In one embodiment a specialty yttrium metal and yttrium metal alloy substrates having a yttrium oxide-comprising coating formed on the metal surface by a thermal oxidation process is created for use in processing environments of the kind encountered in the production of semiconductor and MEMS devices. The metal yttrium and the yttrium oxide produced by thermal oxidation possess similar thermal expansion coefficients, which provides an improved interface between the coating and the underlying substrate. The metal yttrium and the yttrium oxide produced by thermal oxidation exhibit similar thermal conductivity, and that improves the temperature uniformity of the entire component during semiconductor and MEMS processing operations. As a result, less stress is created between the metal yttrium and the yttrium oxide coating, and the performance lifetime of the component is increased.

Table One, below, shows a property comparison of metal yttrium with other metal materials which have been used to fabricate semiconductor processing apparatus components. One of skill in the art can, in view of this table, see the advantages and disadvantages of using metal yttrium relative to the other materials listed. In terms of mechanical properties, the yttrium metal is similar to a number of the other materials which are used as base substrate materials for semiconductor processing equipment. The electrical resistivity of the yttrium metal is very high compared with aluminum or the aluminum alloy, but is better than HASTALLOY® C276, the Titanium alloy, and SST316. The electrical resistivity of the yttrium oxide shown in Table Two can be reduced by adding a dopant material such as zirconium oxide, hafnium oxide, scandium oxide, niobium oxide, samarium oxide, ytterbium oxide, erbium oxide, cerium oxide, neodymium oxide, terbium oxide, dysprosium oxide, and combinations thereof to the yttrium metal prior to oxidation.

TABLE ONE

Property Comparison of Yttrium Metal With Other Metals Used To Fabricate Semiconductor Manufacturing Apparatus

| Property | Yttrium | Aluminum | Al Alloy (6061) | Hastalloy (C276) | $Ti_6Al_4V$ | SST316 |
|---|---|---|---|---|---|---|
| Density (g/cm$^3$) | 4.47-4.48 | 2.70 | 2.70 | 8.89 | 4.42 | 8.0 |
| Melting Point (° K) | 1522-1795 | 933 | NA | 1325-1370 | 1649 ± 15 | NA |
| Boiling Point (° K) | 3338-3611 | 2792 | NA | 2415-2500 | NA | NA |

TABLE ONE-continued

Property Comparison of Yttrium Metal With Other Metals Used To Fabricate Semiconductor Manufacturing Apparatus

| Property | Yttrium | Aluminum | Al Alloy (6061) | Hastalloy (C276) | $Ti_6Al_4V$ | SST316 |
|---|---|---|---|---|---|---|
| Electrical Conductivity (298° K) × $10^6$ ($\Omega^{-1} \cdot m^{-1}$) | 1.75 | 37.7 | 27.0 | 0.77-0.80 | 0.59 | 1.35 |
| Electrical Resistivity (298° K) × $10^-$ ($\Omega \cdot cm$) | 57.0 | 2.65 | 3.70 | 125-130 | 170 | 74.0 |
| Thermal Conductivity (300° K) (W/mK) | 17.2 | 237.0 | 180.0 | 9.8 | 7.2 | 16.3 (373° K) |
| Coeff. Linear Expansion ($K^{-1}$) × $10^{-6}$ (20-100° C.) | 10.6 | 23.1 | 23.4 | 11.2 | 8.6 | 15.9 |
| Young's Modulus (GPa) | 66.3 (Poly) | 70 | 70-80 | 205 | 114 | 193 |
| Bulk Modulus (GPA) | 37.3 (Poly) | 76 | NA | NA | NA | NA |
| Poisson's Ratio | 0.24 | 0.35 | 0.33 | NA | NA | NA |
| Brinell Hardness (MPa) | 30-60 (Soft) 100-140 (Hard) | 245 | NA | 80-200 | NA | 217 |
| Vickers Hardness (MPa) | NA | 167 | NA | NA | NA | NA |
| Mohs Hardness | NA | 2.75 | NA | NA | NA | NA |
| Hardness (HB500) | NA | NA | 30 | 90HRB | 36HRC | 95HRB |
| Tensile Strength (MPa) | 130 (Soft) 455 (Hard) | NA | 115 | 790 | 897-1000 | 515 |
| Yield Strength (MPa) | 57 (Soft) 375 (Hard) | NA | 48 | 355 | NA | 205 |
| Shear Strength (MPa) | NA | NA | 83 | NA | NA | NA |
| Fatigue Strength (MPa) | NA | NA | 62 | NA | NA | NA |
| Elongation (%) | NA | NA | 25 | 61 | 10-18 | 40 |

NA = Not Available

Table Two provides a property comparison between metal yttrium and yttrium oxide. It is readily apparent that the difference in coefficient of linear expansion between the two materials is sufficient to place a yttrium oxide layer, which is on the surface of the metal yttrium, in compression. At the same time, it has been determined that this difference in coefficient of expansion does not cause problems at an interface between the two materials when a layer of yttrium oxide is thermally created upon the surface of an yttrium metal substrate.

TABLE TWO

Property Comparison Of Metal Yttrium and Yttrium Oxide

| Property | Yttrium Metal | Yttrium Oxide |
|---|---|---|
| Coefficient of linear expansion ($K^{-1}$) × $10^{-6}$ (20-100° C.) | 10.6 | 7.2 |
| Thermal Conductivity (300° K) (W/m ° K) | 17.2 | 13.7 |
| Electrical Resistivity (298° K) ($\Omega \cdot cm$) | $57.0 \times 10^{-6}$ | $>10^{14}$ |
| Density (g/cm$^3$) | 4.47-4.48 | 4.92 |
| Melting Point (° K) | 1522-1795 | 2690 |
| Boiling Point (° K) Strength | 3338-3611 | 4300 |
| Tensile Strength (MPa) | 130 soft 455 hard | NA |
| Yield Strength (MPa) | 57 soft 375 hard | NA |
| Flexural Strength (MPa) Hardness | NA | 100 |
| Brinell Hardness (MPa) | 30-60 soft 100-140 hard | NA |
| Vickers Hardness (MPa) | NA | 5.7 |
| Young's Modulus (GPa) | 66.3 | 150 |

NA means Not Available.

When metal yttrium is converted to yttrium oxide by thermal oxidation, two yttrium metal cells (each of which contains 8 yttrium atoms, for a total of 16 yttrium atoms) transforms into one yttrium oxide cell (which comprises $Y_2O_3$ and contains a total of 16 yttrium atoms and 24 oxygen atoms). While this is a volume expansion process, the expansion percentage is smaller than that of the transformation from aluminum to $Al_2O_3$. When 2 moles of metal yttrium are converted to 1 mole of $Y_2O_3$ by thermal oxidation, the volume increases 5.140 cm$^3$. When 2 moles of metal yttrium are converted to 1 mole of $Y_2O_3$ by thermal oxidation, the weight increases by 2.858 g. Table Three, below, shows the theoretical calculation of the crystal structure of metal yttrium and yttrium oxide.

TABLE THREE

Calculated Crystal Structure of Metal Yttrium and Yttrium Oxide

| | Metal Yttrium | $Y_2O_3$ |
|---|---|---|
| Space Group | P63/mmc (Hexagonal) | IA-3 (Cubic) |
| Cell Parameter | a = b = 3.6471, c = 5.7285<br>$\alpha = \beta = 90°, \gamma = 120°$ | a = b = c = 10.5961<br>$\alpha = \beta = \gamma = 90°$ |
| Theoretical Density (g/cm$^3$) | 4.474 | 5.030 |
| Cell Volume (A$^3$) | 65.99 | 1189.70 |
| Molar Volume (cm$^3$/mol) | 19.86 | 44.86 |
| | Volume Expansion when 2 moles of metal Y transforms into 1 mole of $Y_2O_3$.<br>5.14 cm$^3$ | Weight Increase when 2 moles of metal Y transforms into 1 mole of $Y_2O_3$<br>2.858 g |

As can be seen from the above calculations, the $Y_2O_3$ is in a state of compressed stress.

EXAMPLES

Example One

Figure 1:
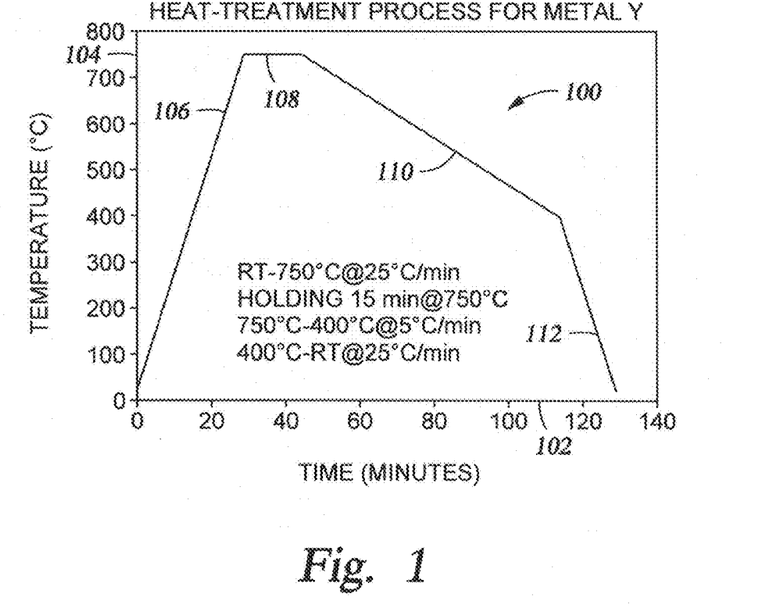
FIG. 1 is a graph 100 showing the processing time at temperature during the conversion of an upper portion of a metal yttrium substrate to yttrium oxide ($Y_2O_3$).
Figure 2:
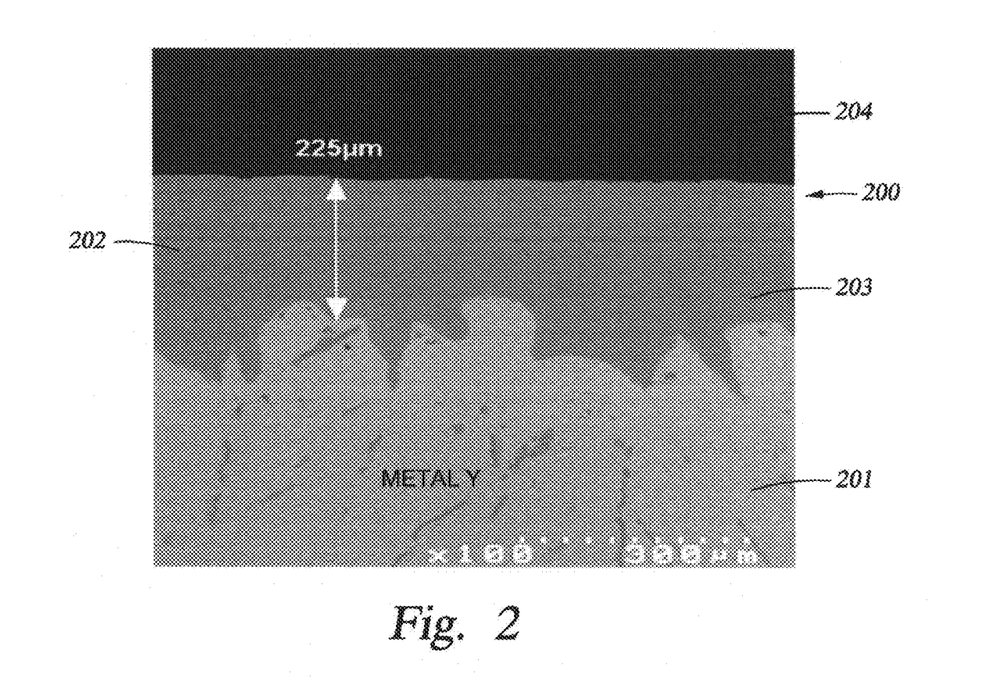
FIG. 2 is a photomicrograph 200 showing the yttrium metal substrate 201 with an overlying yttrium oxide protective layer 202.

FIG. 1 is a graph 100 showing the processing time at temperature during the conversion of metal yttrium to yttrium oxide ($Y_2O_3$) on the surface of a test specimen having dimensions of 1-4 inches (2.5 cm×10.1 cm)×1-4 inches (2.4 cm×10.1 cm)×a thickness ranging from about 0.1 inch (0.25 cm) to about 0.25 inches (0.6 cm). The test specimens were produced from a large bar stock of yttrium metal and were machined to the dimensions described above. Although the average surface roughness on the machined specimens was about 0.1 μm Ra, a surface roughness of up to 1.0 μm Ra has been used with good results. This is a surprising advantage of the present method of producing a yttrium-comprising oxide on the surface of a yttrium metal substrate using a thermal oxidation process. As can be seen in FIG. 2, the interface between the yttrium metal substrate and the thermal oxidation-generated yttrium oxide coating on the substrate surface is free from voids and cracks and follows the surface of the yttrium metal.

Another surprising result was that the rate of oxide formation was relatively linear. By way of theory and not by way of limitation, it appears as if the oxygen atoms are moving along grain boundaries, progressing down the crystalline structure. In this manner, the oxygen continues to travel downward through the grain boundaries so that the growth is constantly from the top of the structure. This is distinct from an anodization process, for example, which appears to be diffusion limited, and to require that the chemical reactant diffuse down into the crystalline structure to react at the base of the previously-formed reacted material. In the case of anodization, the typical maximum thickness for an anodized layer is about 8 μm.

The substrate used in this Example One was a trace element doped yttrium metal, where the trace metal content was smaller than 0.1 weight %. (In general the amount of dopant added to the yttrium metal or yttrium metal alloy will be less than about 0.1 weight %.) In particular, 20 ppm of magnesium, 100 ppm of aluminum, 200 ppm of copper, and 500 ppm of calcium was added to pure yttrium metal to produce the substrate. Through this doping, the grain boundary structure of the yttrium oxide layer formed will be adjusted as an oxygen diffusion path, providing a high diffusion rate for oxygen from the surface of the oxide toward the interface between the oxide and the underlying metal substrate. The relationship between the oxide layer thickness and the thermal process time is a linear relationship. In general, the advantageous concentration ranges for these dopants are: magnesium 10 ppm by weight to 30 ppm by weight; aluminum 10 ppm by weight to 110 ppm by weight; copper 50 ppm by weight to 300 ppm by weight; and, calcium 10 ppm by weight to 800 ppm by weight.

The specimen was placed in a thermal oxidation furnace, Model No. 55031-12, available from Applied Materials, Inc. of Santa Clara, Calif. The ambient environment in the furnace was air. Other gas compositions, where the oxygen content is lower or higher than the 21% by volume of air may be used as well. As previously discussed, the oxygen content may range from about 5% by volume up to 100% by volume. When dopant is used, the oxygen infuses faster and the oxygen content may range from about 5% by volume to about 15% by volume.

The time-temperature profile illustrated in FIG. 1 is the best known profile at this time, for a component having a pure yttrium metal substrate with a yttrium oxide overlying protective layer. The time temperature profile is based on experimentation. At higher temperatures, 750° C., for example, the yttrium oxide crystal growth is rapid; however, the crystal growth is such that the average grain size is larger, in the range of about 5 μm to about 50 μm. A smaller grain size for the cubic yttrium oxide crystals is preferable at the interface between the hexagonal yttrium metal substrate and the cubic yttrium oxide overlying protective layer, to reduce the strain at this interface.

As previously described, the crystal growth of the yttrium oxide tends to occur by transfer of the oxygen atoms down the yttrium oxide structure toward the yttrium metal crystalline interface. As a result, the growth of the cubic yttrium oxide crystals is constantly taking place at the surface of the yttrium metal crystalline structure. Thus, if the temperature of reaction is high initially and then lower subsequently, the smaller cubic yttrium oxide crystals will be present at the interfacial surface of the yttrium metal with the yttrium oxide, to reduce the strain between the cubic yttrium oxide substrate and the overlying hexagonal yttrium oxide layer. FIG. 1, which shows a graph 100 illustrating the thermal oxidation process used to create a yttrium oxide protective layer on the surface of an underlying yttrium metal substrate. The processing temperature is shown on axis 104 in ° C, and the processing time is shown in minutes on axis 102. Initially, the yttrium metal substrate is heated at a rapid rate of about 25° C./min, for a time period of about 29 minutes, to increase the temperature of the yttrium metal substrate from room temperature to about 750° C., as illustrated on the graph 100 at 106. The temperature is then held at about 750° C. for a time period of about 15 minutes to provide for a rapid initial growth of large grained yttrium oxide crystals, as illustrated on the graph 100 at 108. Subsequently, the temperature is lowered more slowly, at a rate of about 5° C./min, as illustrated on graph 100 at 110, for a time period of about 70 minutes, down to a temperature of about 400° C. At 400° C. the crystal growth of yttrium oxide is very slow, and effectively, essentially ceases. Subsequently, the substrate yttrium metal with overlying yttrium oxide protective layer is rapidly cooled, at about 25° C./min from the 400° C. to room temperature (about 25° C.), over a time period of about 15 minutes, as illustrated on graph 100 at 112.

In general, the metal or metal alloy substrate may be heated at a rapid rate ranging from about 20° C./min to about 100°

C./min, to increase the temperature of the substrate from room temperature to a holding temperature, which may range from about 700° C. to about 1050° C. The substrate temperature may be held at the holding temperature for thermal oxidation over a time period ranging from about 5 minutes to about 5 hours, to provide for a rapid initial growth of large grained oxide crystals. Subsequently, the temperature of the substrate may be lowered more slowly, at a rate ranging from about 10° C./min to about 0.5° C./min down to a temperature of about 400° C. or lower, to permit the growth of smaller grain oxide crystals. Once the temperature of the substrate is in the range of about 400° C. or lower, the substrate may be cooled more rapidly at a cooling range ranging from about 25° C./min to about 35° C./min to bring the substrate back to ambient temperature.

In the past, when a layer of yttrium oxide was created using an electrolysis process, the maximum thickness of the yttrium oxide obtained on a yttrium metal surface, was in the range of about 5.5 µm to about 8 µm, for example, because the reaction slows substantially as the oxide thickness increases. The present method is not so limited, and the yttrium metal substrate treated in the manner described above and illustrated in FIG. 1 provided a yttrium oxide coating thickness of about 200 µm to 240 µm on the side of the yttrium metal which was exposed to the treatment. A portion of the substrate was consumed during the oxidation process, and the crystal structure packing adjusted. As a result, the thickness increase of the substrate after the thermal oxidation process having the profile shown in FIG. 1 was about 32 µm.

FIG. 2 is a photomicrograph 200 showing a sectional side view of a yttrium metal substrate 201 with an overlying yttrium oxide protective layer 202, which was prepared using the time temperature profile illustrated in FIG. 1. The oxygen for the oxidation reaction was supplied by ambient was air, which was constantly flowed through the furnace during oxidation of the yttrium metal. The scale on the photomicrograph represents 300 µm and is at a magnification of 100× the original sample size. The surface 203 of the yttrium metal is relatively rough and non-uniform; however, the yttrium oxide 202 makes a continuous interface with the yttrium metal substrate, without evidence of the presence of cracking or separation or voids at the interface. A typical surface roughness for metal oxides created by the method described herein may range from about 0.1 µm Ra to about 10 µm Ra. The average surface 204 roughness for the yttrium oxide coating 202 in this example was about 0.81 µm Ra. This is about 3.6 times less than the surface roughness of competitive yttrium oxides surfaces available in the market, and is an indication that the yttrium oxide coating developed by the present inventors will show a significant reduction in particle generation when a component prepared using the method described herein is exposed to a corrosive plasma.

Example Two

The profile may be adjusted to account for a change in composition of the yttrium metal-comprising substrate. For example, the substrate may not be a pure metal, but may contain another element, and the metal may be selected from the group consisting of Nd, Sm, Tb, Dy, Er, Yb, Sc, Hf, and Nb, or combinations thereof, by way of example and not by way of limitation. The amount of other elements which may be present in the yttrium metal-comprising substrate may vary from 0% by weight up to about 50% by weight. Further, other metals may be alloyed with one of the metals of the kind listed above to provide improved mechanical or electrical properties. For example, aluminum may be alloyed with any of the metals, or combinations of metals listed above.

Figure 6:
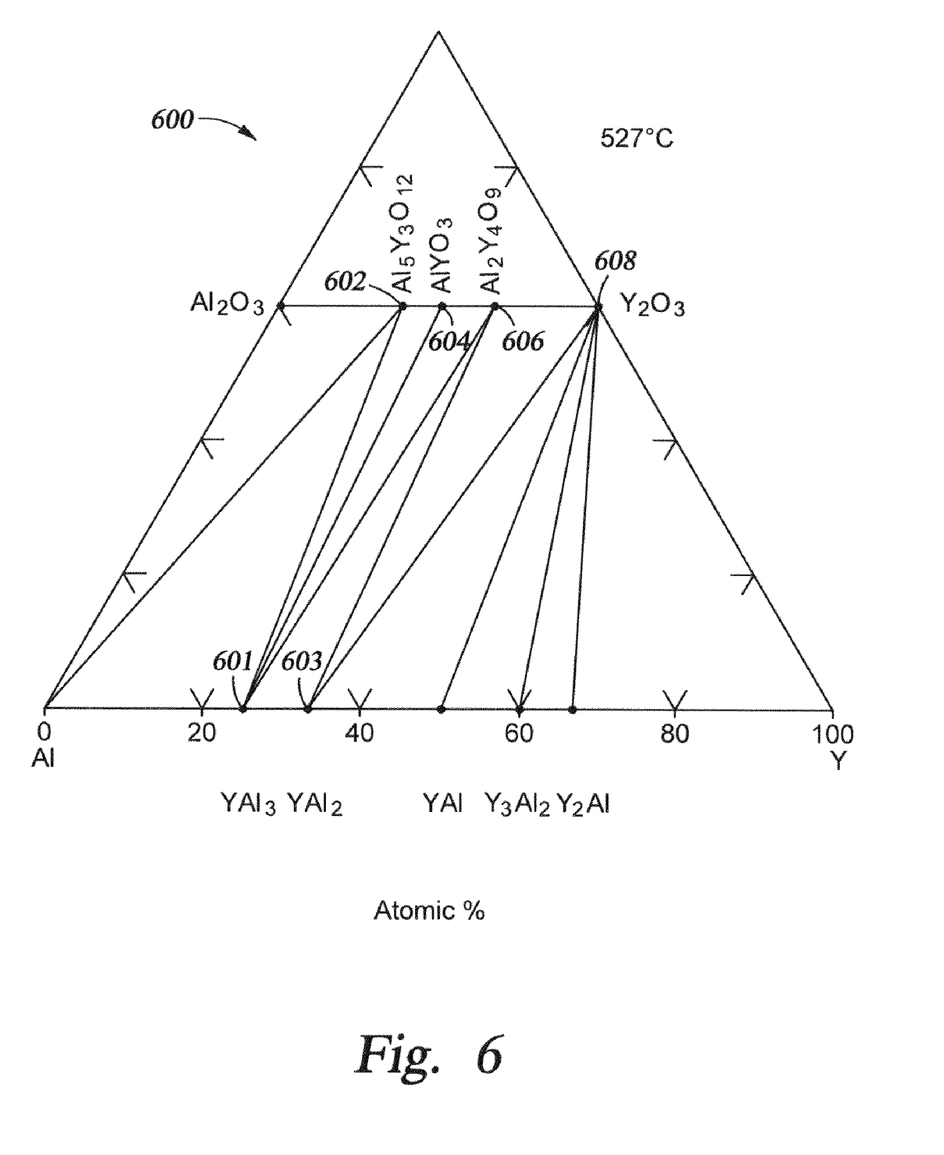
FIG. 6 is a phase diagram 600 which shows yttrium aluminum alloys (compounds) and the composition of oxides which are formed from those alloys at a thermal oxidation temperature of about 525° C.

FIG. 6 shows a phase diagram 600 for alloys of yttrium with aluminum. The compound formed depend on the relative amounts of yttrium and aluminum which make up the alloy. The oxides which are formed on thermal oxidation depend on the compound which is being oxidized. For example, when the yttrium content in the alloy is about is about 25 atomic %, the compound formed is $YAl_3$ (601) and the oxides formed at 527° C. may be $Al_5Y_3O_{12}$ (602), $AlYO_3$ (604), and $Al_2Y_4O_9$ (606). When the yttrium content in the alloy is about 33 atomic %, the compound formed is $YAl_2$ (603), and the oxides formed are $Al_2Y_4O_9$ (606) and $Y_2O_3$ (608). At yttrium concentrations of about 50 atomic % and higher, at 527° C., yttrium oxide will be formed.

The general shape of the advantageous time temperature profile for the thermal oxidation process remains essentially the same for yttrium alloys as the 106, 108, 110, 112 portions of the graph shown in FIG. 1. However, the maximum temperature used, and the heating and cooling rates may be slightly different, to provide optimum results. One of skill in the art after reading the present description will be able to optimize the crystal growth profile for a yttrium metal alloy in accordance with the concepts provided herein, with minimal experimentation necessary.

Example Three, Comparative Example

Figure 3A:
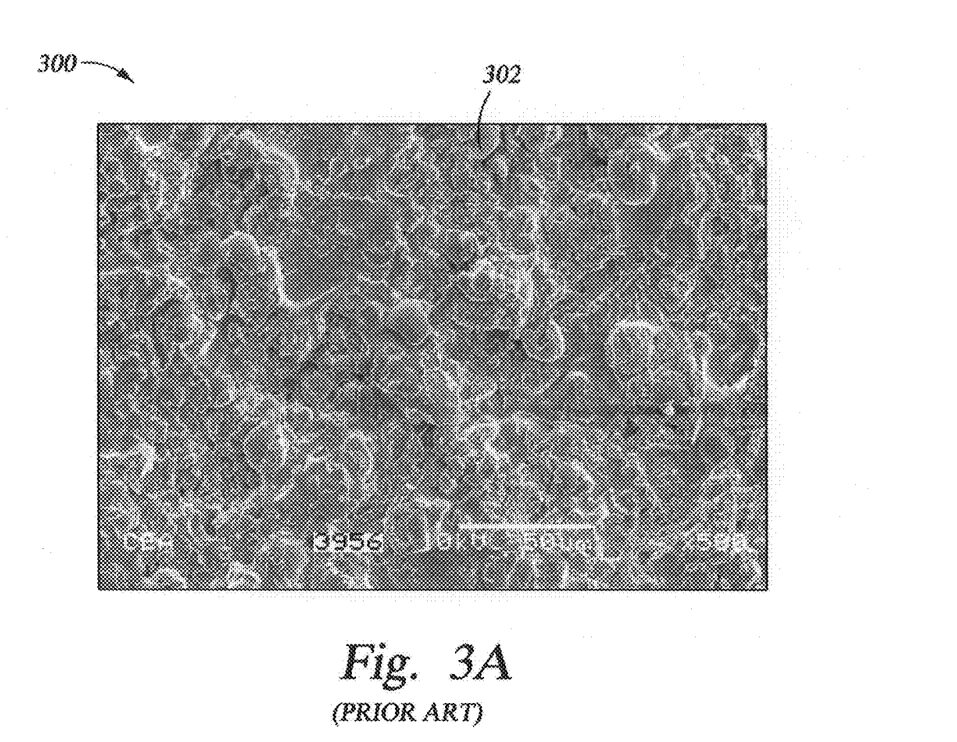
FIGS. 3A and 3B, show the difference between the rough surface of a prior art yttrium oxide coating which was created by plasma spraying (FIG. 3A) and the smooth surface of a yttrium oxide coating grown by the thermal oxidation method of the present invention (FIG. 3B).
Figure 3B:
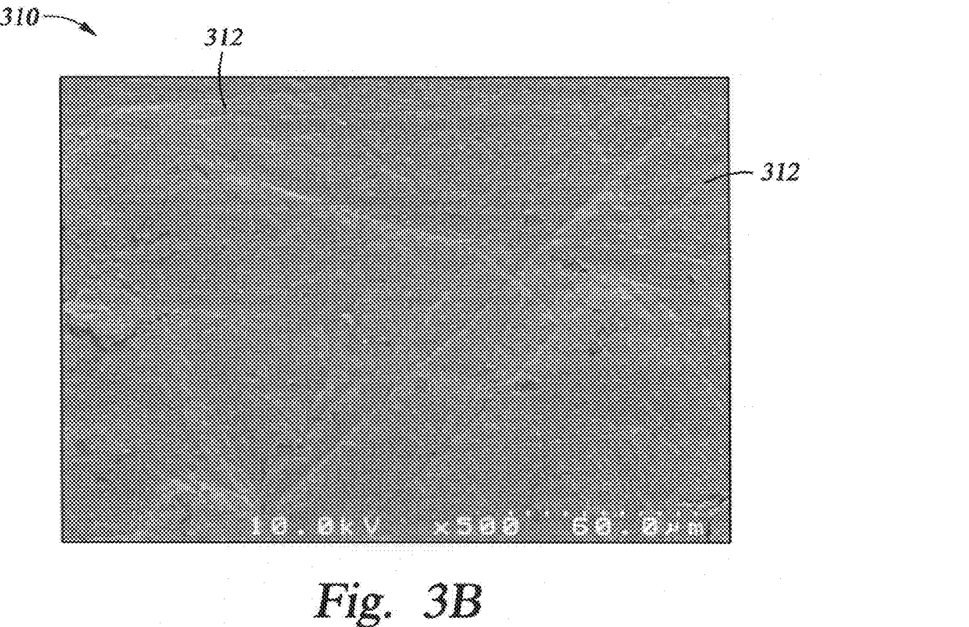

FIGS. 3A and 3B, show the difference between the rough surface 302 of a prior art yttrium oxide coating prepared using a plasma spray process of the kind known in the art. (FIG. 3A) and the smooth surface of a yttrium oxide coating grown by the present thermal oxidation method (FIG. 3B).

FIG. 3A is a photomicrograph 300 which shows a yttrium oxide coating prepared by the plasma spray process as described above. This was one of the commonly used methods of providing a yttrium oxide coating prior to the present invention. The scale on the photomicrograph represents 50 µm. The average surface roughness for this yttrium oxide coating is about 3.11 µm Ra. FIG. 3B is a photomicrograph 310 which shows a yttrium oxide coating prepared using the method described herein. The scale on the photomicrograph represents 60 µm. The average surface roughness for this yttrium oxide coating is about 0.86 µm Ra. The topography of the surface of the yttrium oxide of the prior art, shown in photomicrograph 300, illustrates that the previous yttrium oxide surface is susceptible to attack by a reactive plasma, and capable of producing particulates when the plasma eats away the connecting structure beneath the extended nodes. The topography of the yttrium oxide of the kind produced by the present invention, shown in photomicrograph 310, illustrates that the surface of the yttrium oxide produced by the method of the invention is much less subject to attack by a reactive plasma, and that particulate formation should be substantially reduced, if not avoided altogether.

Example Four

FIGS. 4A through 4E show various aspects of the growth of a protective yttrium oxide coating over the surface of a metal yttrium substrate, in areas which have been machined to form openings through the metal yttrium substrate.

Figure 4A:
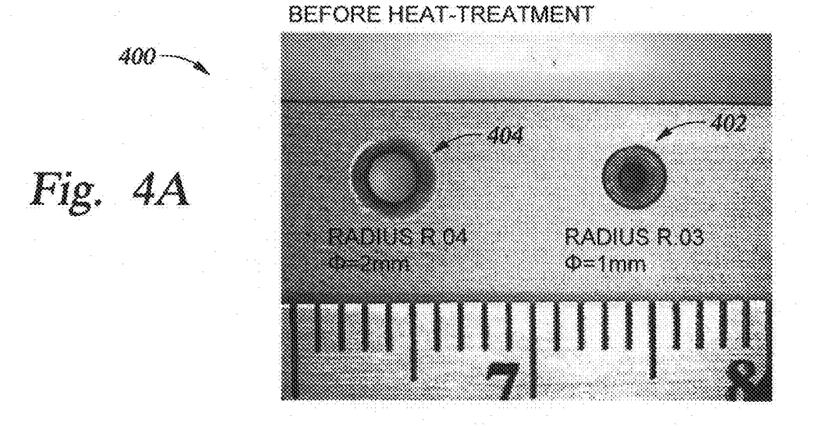
FIG. 4A shows an optical micrograph image of the upper surface of a yttrium metal test coupon with two openings machined through the test coupon. One opening was drilled to provide a diameter of about 2 mm. A second opening was drilled to provide a diameter of about 1 mm.

FIG. 4A shows an optical micrograph image 400 of the upper surface 401 of a yttrium metal test coupon with two openings 402 and 404 machined through the test coupon. The first opening 402 was drilled to provide a diameter φ of about 2 mm. A second opening 404 was drilled to provide a diameter φ of about 1 mm.

Figure 4B:
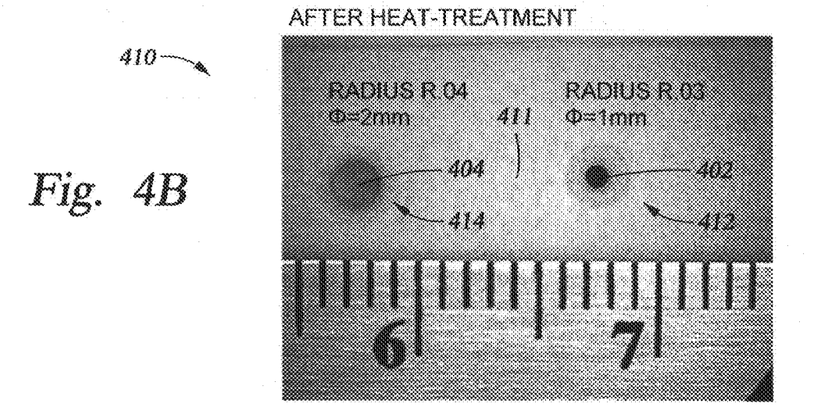
FIG. 4B shows the optical micrograph image of the upper surface of the test coupon shown in FIG. 4A, but after thermal oxidation of the surface of the yttrium metal to produce a yttrium oxide protective layer.
Figure 4C:
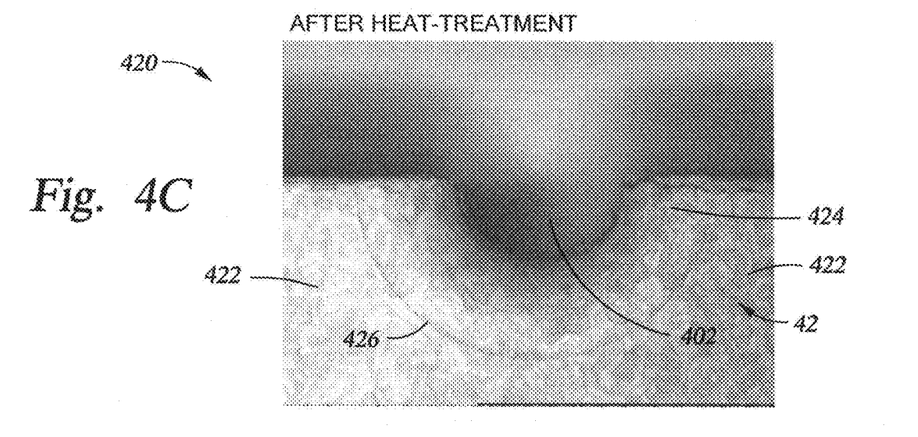
FIG. 4C shows an enlargement of the 1 mm diameter opening 402 after the thermal oxidation process, which is illustrated in FIG. 4B.

FIG. 4B shows the optical micrograph image 410 of the upper surface 411 of the test coupon shown in FIG. 4A, but after thermal oxidation of the surface of the yttrium metal, using the method described herein, to produce yttrium oxide protective coatings 412 and 414, respectively. FIG. 4C shows an enlargement 420 of the ≅1 mm diameter φ opening after the thermal oxidation process, which is illustrated in FIG. 4B. The surrounding yttrium metal 422 forms a nice transition with the yttrium oxide coating 424. The perimeter 426 of the coated opening 421 is very smooth and shows no evidence of separation or gaps between the yttrium oxide coating 424 material and the yttrium metal substrate 422.

Figure 4D:
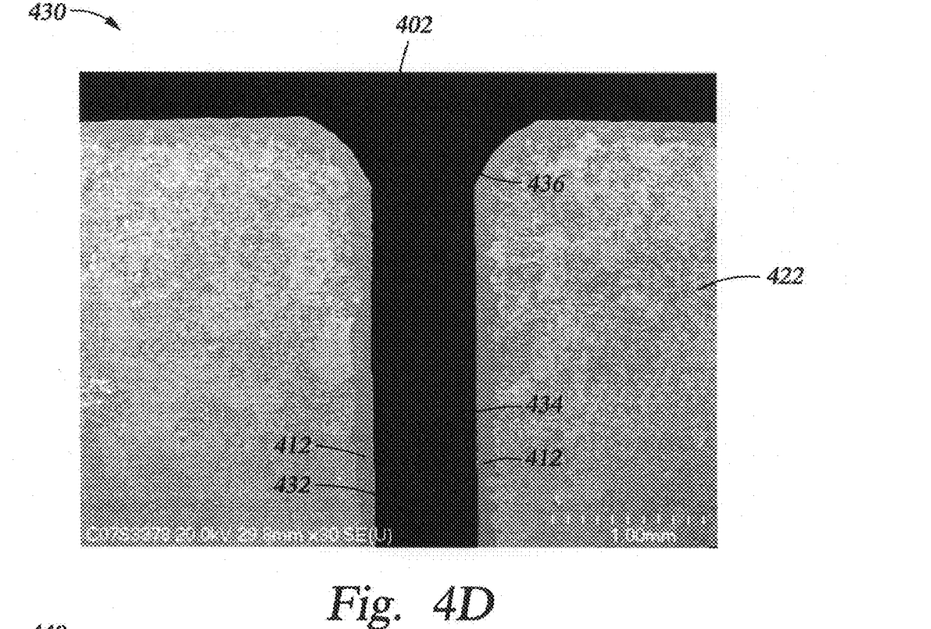
FIG. 4D shows a cross-sectional, side view, photomicrograph of the counter sunk drilled opening 402 shown in FIG. 4C, to illustrate the continuous, uniform yttrium oxide coating 412 which was produced all the way from the counter sunk upper opening area 436, down through the lower section 432 of the opening 402.

FIG. 4D shows a cross-sectional, side view, photomicrograph 430 of the counter sunk 436, drilled opening 402 shown in FIG. 4C, to illustrate the continuous, uniform yttrium oxide coating 412 which was produced all the way from the counter sunk upper opening area 436, down through the lower section 432 of the opening 402.

Figure 4E:
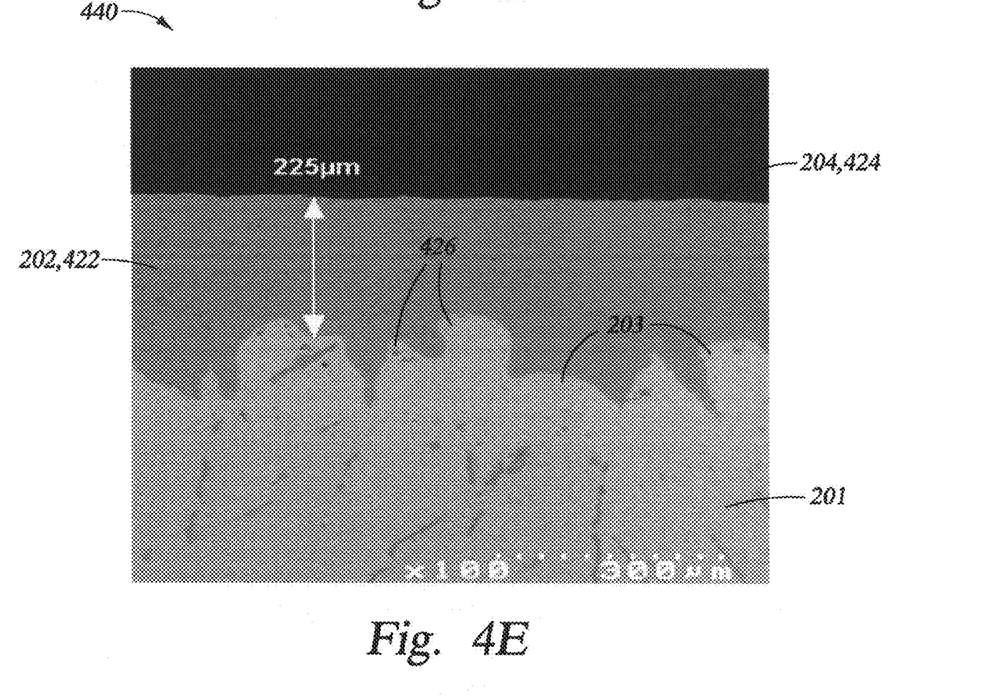
FIG. 4E shows the same image of the interface 203 of the yttrium oxide coating 202 with the yttrium metal substrate 201 which was shown in FIG. 2, and also is marked to illustrate the rough surface 426 of the yttrium metal surface, as well as the smooth surface 424 of the yttrium oxide coating.

FIG. 4E shows the same image of the interface 203 of the yttrium oxide coating 202 with the yttrium metal substrate 201 which was shown in FIG. 2, and also is marked to illustrate the rough surface 426 of the yttrium metal, as well as the smooth surface 424 of the yttrium oxide coating.

Example Five

Figure 5A:
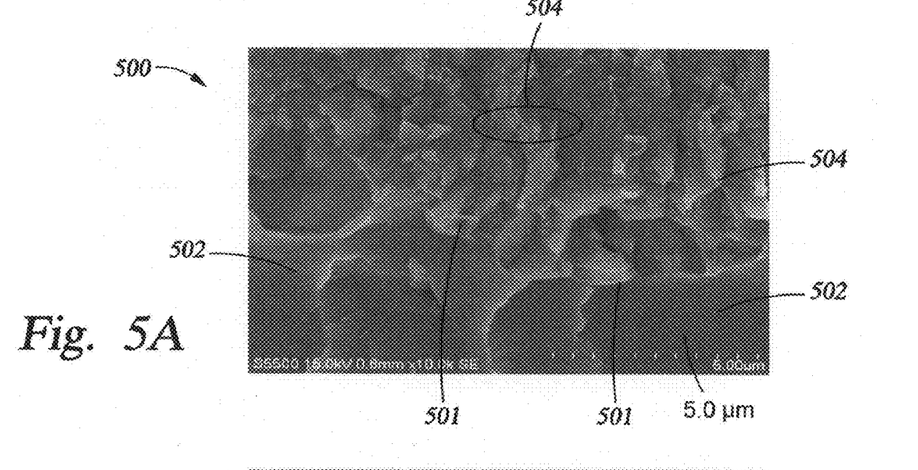
FIG. 5A shows a photomicrograph 500 of a side view cross-sectional image of an area of the yttrium metal substrate 502, with interface 501 and yttrium oxide coating 504.
Figure 5B:
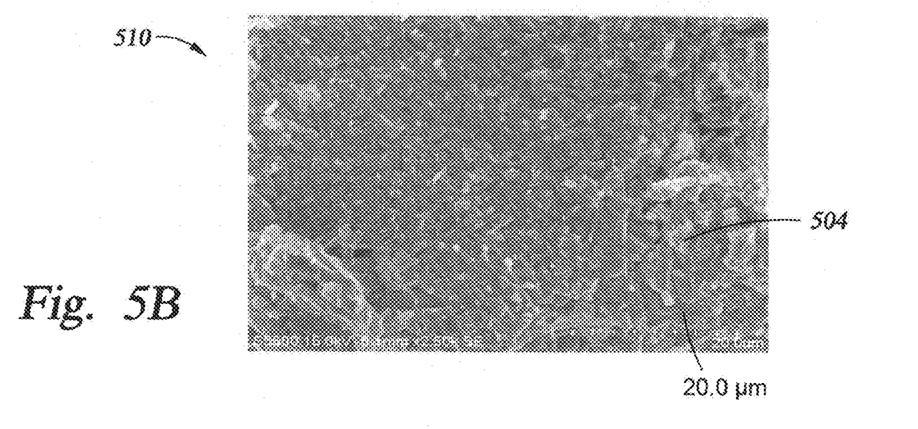
FIG. 5B shows a photomicrograph 510 of a side view cross-sectional image of an area of yttrium oxide coating 504 from a greater distance than shown in FIG. 5A, to better illustrate the overall texture of the yttrium oxide coating.
Figure 5C:
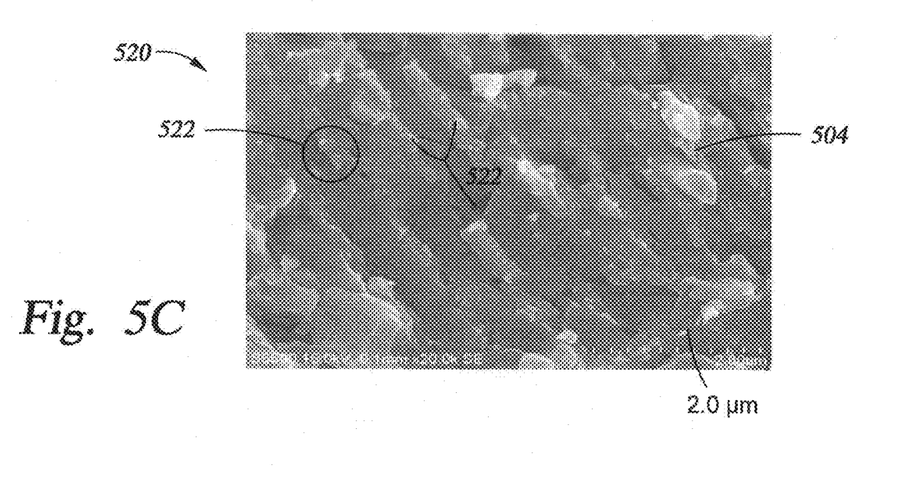
FIG. 5C shows a photomicrograph 520 of a side view cross-sectional image of an area of yttrium oxide coating 504 from a closer distance than shown in FIG. 5A, to better illustrate the columnar structure 522 of the yttrium oxide coating crystals in general.

FIG. 5A shows a photomicrograph 500 of a side view cross-sectional image of an area of the yttrium metal substrate 502, with interface 501 and yttrium oxide coating 504. The scale on the photomicrograph represents 5 μm. FIG. 5B shows a photomicrograph 510 of a side view cross-sectional image of an area of yttrium oxide coating 504 from a greater distance (a smaller magnification) than shown in FIG. 5A, to better illustrate the overall texture of the yttrium oxide coating. The scale on the photomicrograph represents 20 μm. FIG. 5C shows a photomicrograph 520 of a side view cross-sectional image of an area of yttrium oxide coating 504 from a closer distance (at higher magnification) than shown in FIG. 5A, to better illustrate the columnar structure 522 of the yttrium oxide coating crystals in general. The scale on the photomicrograph represents 2.0 μm. As previously discussed, it is this columnar structure which permits the growth of thicker films of yttrium oxide, and the size of the crystal grains within the columnar structure is controlled to be larger at the top surface of the coating and smaller at the interface with the yttrium metal substrate.

While the foregoing is directed to embodiments of the present invention, other and further embodiments of the invention may be devised in view of the present disclosure, without departing from the basic scope of the invention, and the scope thereof is determined by the claims which follow.

We claim:

1. An article which is resistant to corrosion or erosion by chemically active plasmas, said article comprising:
a metal or metal alloy substrate comprising a metal selected from the group consisting of yttrium, neodymium, samarium, terbium, dysprosium, erbium, ytterbium, scandium, hafnium, niobium and combinations thereof, and at least one dopant selected from the group consisting of zirconium oxide, hafnium oxide, scandium oxide, niobium oxide, samarium oxide, ytterbium oxide, erbium oxide, cerium oxide, neodymium oxide, terbium oxide, dysprosium oxide, and combinations thereof; and
an oxide coating which is a thermal oxide of said metal or metal alloy including said at least one dopant, wherein a structure of said oxide coating is columnar in nature, wherein a grain size of crystals in said oxide coating is larger at an exposed surface of said oxide coating than at an interface between said oxide coating and said metal or metal alloy substrate, and wherein said oxide coating is in compression at said interface between said oxide coating and said metal or metal alloy substrate.

2. An article in accordance with claim 1, wherein said metal or metal alloy also contains aluminum.

3. An article in accordance with claim 1, wherein said metal is yttrium.

4. An article in accordance with claim 1, wherein said metal alloy includes yttrium.

5. An article in accordance with claim 1, wherein a thickness of said oxide coating ranges from about 1 μm to about 500 μm.

6. An article in accordance with claim 1, wherein an exterior surface of said coating, which is a thermal oxide of said metal or metal alloy including said at least one dopant, has a surface roughness ranging from about 0.1 μm Ra to about 10 μm Ra.

7. An article which is resistant to corrosion or erosion by chemically active plasmas, said article comprising:
a metal or metal alloy substrate comprising a metal selected from the group consisting of yttrium, neodymium, samarium, terbium, dysprosium, erbium, ytterbium, scandium, hafnium, niobium or combinations thereof, and at least one dopant selected from the group consisting of magnesium, aluminum, copper, calcium, and combinations thereof; and
an oxide coating which is a thermal oxide of said metal or metal alloy including said at least one dopant, wherein a structure of said oxide coating is columnar in nature, wherein a grain size of crystals in said oxide coating is larger at an exposed surface of said oxide coating than at an interface between said oxide coating and said metal or metal alloy substrate, and wherein said oxide coating is in compression at said interface between said oxide coating and said metal or metal alloy substrate.

8. An article in accordance with claim 7, wherein a thickness of said oxide coating ranges from about 1 μm to about 500 μm.

9. An article in accordance with claim 7, wherein said at least one dopant comprises a combination of magnesium, aluminum, copper, and calcium, and wherein the concentration range of magnesium ranges from about 10 ppm by weight to about 30 ppm by weight, the concentration range of aluminum ranges from about 10 ppm by weight to about 110 ppm by weight, the concentration range of copper ranges from about 50 ppm by weight to about 300 ppm by weight, and the concentration range of calcium ranges from about 10 ppm by weight to about 800 ppm by weight.

10. An article in accordance with claim 7, wherein an exterior surface of said coating, which is a thermal oxide of said metal or metal alloy including said at least one dopant, has a surface roughness ranging from about 0.1 μm Ra to about 10 μm Ra.

* * * * *

UNITED STATES PATENT AND TRADEMARK OFFICE
CERTIFICATE OF CORRECTION

PATENT NO. : 8,129,029 B2
APPLICATION NO. : 12/004907
DATED : March 6, 2012
INVENTOR(S) : Jennifer Y. Sun et al.

It is certified that error appears in the above-identified patent and that said Letters Patent is hereby corrected as shown below:

In the Drawings:

Replace Page 5 of the Formal Drawings with the attached Replacement Page 5.

In the Specification:

Column 1, lines 65 - 67 continuing to Column 2, lines 1 - 9 should read:

"Yttrium oxide is a ceramic material which has shown considerable promise in the protection of aluminum and aluminum alloy surfaces which are exposed to halogen-containing plasmas of the kind used in the fabrication of semiconductor devices. An yttrium oxide coating has been used and applied over an anodized surface of a high purity aluminum alloy process chamber surface, or a process component surface, to produce excellent corrosion protection (e.g. U.S. Patent No. 6,776,873 to Sun et al., mentioned above). The protective coating may be applied using a method such as spray coating, physical vapor deposition (PVD) or chemical vapor deposition (CVD) by way of example."

Signed and Sealed this
Eighteenth Day of February, 2014

Michelle K. Lee
*Deputy Director of the United States Patent and Trademark Office*

UNITED STATES PATENT AND TRADEMARK OFFICE
CERTIFICATE OF CORRECTION

Page 1 of 2

PATENT NO. : 8,129,029 B2
APPLICATION NO. : 12/004907
DATED : March 6, 2012
INVENTOR(S) : Jennifer Y. Sun et al.

It is certified that error appears in the above-identified patent and that said Letters Patent is hereby corrected as shown below:

In the Drawings:

Replace Page 5 of the Formal Drawings with the attached Replacement Page 5.

In the Specification:

Column 1, lines 65 - 67 continuing to Column 2, lines 1 - 9 should read:

"Yttrium oxide is a ceramic material which has shown considerable promise in the protection of aluminum and aluminum alloy surfaces which are exposed to halogen-containing plasmas of the kind used in the fabrication of semiconductor devices. An yttrium oxide coating has been used and applied over an anodized surface of a high purity aluminum alloy process chamber surface, or a process component surface, to produce excellent corrosion protection (e.g. U.S. Patent No. 6,776,873 to Sun et al., mentioned above). The protective coating may be applied using a method such as spray coating, physical vapor deposition (PVD) or chemical vapor deposition (CVD) by way of example."

This certificate supersedes the Certificate of Correction issued February 18, 2014.

Signed and Sealed this
Second Day of September, 2014

Michelle K. Lee
*Deputy Director of the United States Patent and Trademark Office*